United States Patent [19]

Coates

[11] Patent Number: 4,743,757

[45] Date of Patent: May 10, 1988

[54] SECONDARY ELECTRON EMISSION CONTROL IN ELECTRON MICROSCOPES

[75] Inventor: Vincent J. Coates, Palo Alto, Calif.

[73] Assignee: Nanometrics Incorporated, Sunnyvale, Calif.

[21] Appl. No.: 924,806

[22] Filed: Oct. 30, 1986

[51] Int. Cl.$^4$ .............................................. H01J 37/04
[52] U.S. Cl. .................................... 250/310; 250/397
[58] Field of Search ................ 250/310, 397, 307, 309

[56] References Cited

U.S. PATENT DOCUMENTS 4,596,929  6/1986  Coates .................................. 250/397

*Primary Examiner*—Carolyn E. Fields
*Assistant Examiner*—John A. Miller
*Attorney, Agent, or Firm*—Linval B. Castle

[57] ABSTRACT

In a scanning electron microscope, a co-planar, split grid is interposed between an electron bombarded specimen and scintillator. A first positive potential is applied to one element of the split grid and a positive potential, variable with respect to the first potential, is applied to the other grid element for selectively controlling the collection of secondary emission electrons to thereby eliminate uneven secondary electron distribution that may result from various topographical features of the specimen.

4 Claims, 2 Drawing Sheets

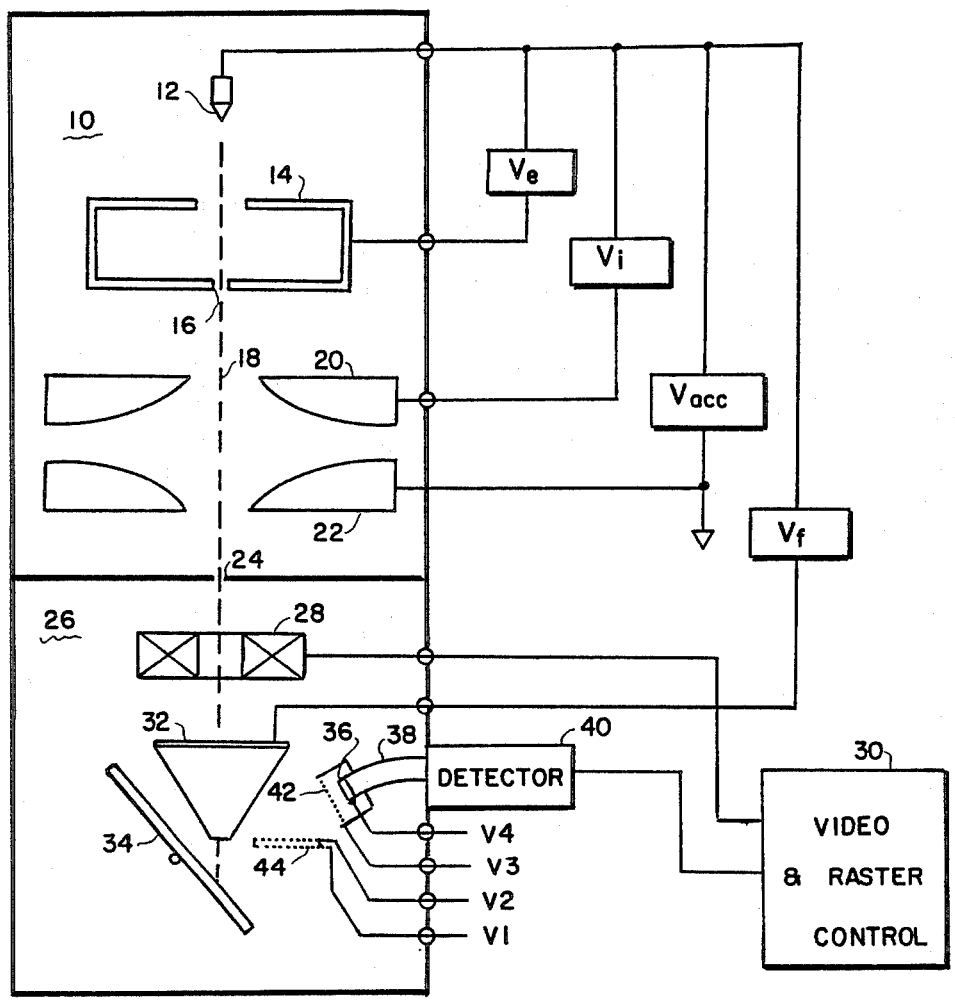
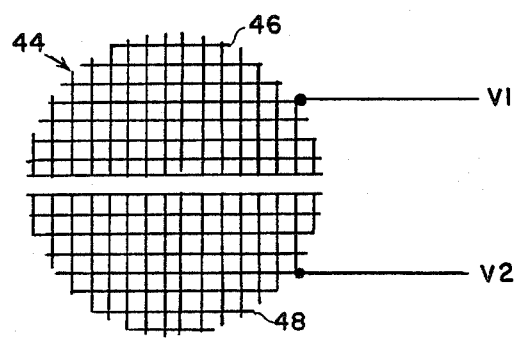
FIG. 1
FIG. 2

N(e)

HORIZONTAL SCAN

SECONDARY ELECTRON EMISSION CONTROL IN ELECTRON MICROSCOPES

BRIEF SUMMARY OF THE INVENTION

This invention relates generally to electron microscopes and in particular to a novel split grid interposed in a scanning electron microscope between a specimen and secondary electron detector. Each segment of the co-planar split grid may have different applied potentials for adjusting and controlling the flow of secondary electrons to the detector and hence the illumination balance on photographic images of the specimen.

The split grid to be described is an improvement over a one-piece grid described and claimed in U.S. Pat. No. 4,596,929, issued on June 24, 1986, a portion of which will be briefly reviewed herein. While the patented one-piece grid performed very well in attracting substantially all secondary emission electrons released from an electron bombarded specimen and for directing them toward a scintillator and detector, the scanning action of the electron beam across the surface of a specimen was accompanied by variations in the flow of secondary emission electrons. For example, as the beam scanned across a rising edge of a conductor, more secondary emission electrons were collected than in the case of a downgoing edge. When the detected signal was converted into a photographic image, the rising edge of the scanned specimen was much more intense than the image of the downgoing edge.

When a split grid is employed in place of the patented one-piece grid, different potentials may be applied to each segment to thereby adjust and balance the quantities of secondary electrons collected from rising and downgoing edges of a scanned specimen and to thus produce a photographic image with uniform intensities.

BRIEF DESCRIPTION OF THE DRAWINGS

In the drawings which illustrate the preferred embodiment of the invention:

FIG. 1 is a schematic elevational view of a simplified scanning electron microscope employing a split grid between specimen and detector;

FIG. 2 is a plan view of the split grid of the invention;

DETAILED DESCRIPTION OF THE PREFERRED EMBODIMENT

Figure 3:
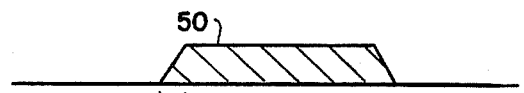
FIG. 3 is a greatly enlarged sectional elevation of a typical specimen scanned by a scanning electron microscope.

FIG. 1 is a sectional elevational view illustrating a typical scanning electron microscope employing the split grid. As previously noted, the invention to be described is an improvement over the one-piece grid assembly described in U.S. Pat. No. 4,596,929, dated June 24, 1986.

Illustrated in FIG. 1 is a field emission scanning electron microscope including a high vacuum changer 10 containing a pointed electron emitter 12 at a high negative potential with respect to an extractor anode 14 which has a small beam defining aperture 16. The narrow electron beam 18 is collimated by an electrostatic field between anodes 20 and 22 and is passed through a vacuum isolation gate 24 between the high vacuum changer 10 and a lower vacuum specimen chamber 26. The beam then passes through the center of X-Y deflection coils 28 that are energized by current from a video and raster control circuit 30 and the beam then passes through the bore of a focusing lens 32 which preferably has a conical envelope which enables close examination of edges and profiles of specimens on a tiltable stage 34. Upon striking a specimen the beam will cause secondary electrons to be emitted which are detected by an electron detector such as an aluminized scintillator button 36 coupled to a fiber optic light pipe 38 and detector circuit 40. Since such scintillators operate at voltages in the order of +10 kv, they not only draw the secondary emission electrons from the specimen but also deleteriously deflect the incoming electron beam from the desired focal point on the specimen. Therefore it is the practice to shield the scintillator with a low voltage grid 42 at a potential of about +300 volts to attract the secondary emission electrons and then pass them to the scintillator where they are converted into optical photons and, eventually, into video output signals which are synchronized with the current signals applied to the X-Y deflection coils 28.

As noted in the previously referenced patent, because of the proximity of the low voltage grid 42 and its conductive housing to the grounded housing of the focusing lens 32, the electrostatic field established between them can become ineffectively positioned for secondary electron collection. Because of the relatively long path between the specimen and the electrostatic field, which acts to convey the secondary emission electrons to the scintillator, a considerable quantity of the secondary electrons stray and become collected by various other components. This results in fewer electrons at the scintillator and a reduction in detection efficiency.

This problem was overcome in the referenced patent by the addition of a second grid between the low voltage grid 42 and the electron beam focal point on the surface of a specimen on the stage 34. This one-piece grid was held at a positive DC voltage of between 10 to 100 volts, it was positioned adjacent or slightly below the apex of the grounded housing of the conical focusing lens 32 and, because it confined the electrostatic field pattern to the area below the apex of the lens 32, it attracted virtually all secondary emission electrons.

Scanning across a specimen with the patented prior art one-piece grid results in strong output signals but signals which vary in intensity according to the contours on the specimen. This problem is readily correctable by use of the present split grid 44 in place of the patented one-piece grid discussed above.

Illustrated in FIG. 1 between the low voltage grid 42 and the specimen on the tiltable stage 34 and adjacent or slightly below the apex of the conical focusing lens is the split grid 44 which is preferably comprised of two co-planar, semicircular, fine mesh grids 46 and 48 as illustrated in the plan view of FIG. 2. One of the grids, such as the grid 46, is adjusted at some potential of, for example +90 VDC, while the potential on the other grid 48 may be adjusted below and above this fixed level to thereby reduce or improve the flow of secondary emission electrons from the bombarded specimen. In general, any method of applying voltages, positive with respect to the sample surface, to the two co-planar grids may be used as long as there is the ability to set a voltage difference between them to thereby attract a substantially equal secondary electron flow through both.

FIG. 3 is an enlarged cross sectional elevational view of a portion of specimen 50 being scanned by an electron microscope, and FIG. 4 illustrates three examples of the quantity of collected secondary emission controls, N(e), vs. Horizontal Scan across the specimen of FIG. 3. It is assumed that the specimen 50 is scanned from left to right.

Figure 4A:
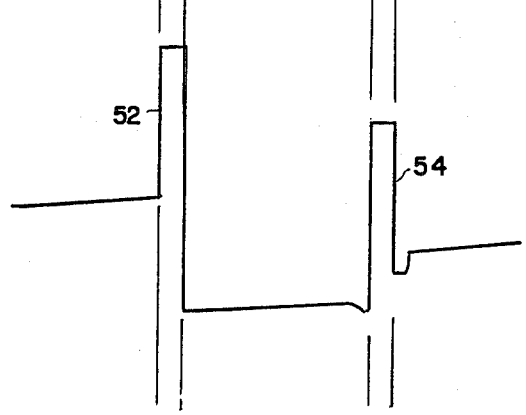
FIG. 4a through 4c represent typical response curves of collected secondary emission electrons vs. horizontal scan in which the potential applied to a second segment of the split grid is (a) too low with respect to that on the first segment, (b) is properly adjusted with reference to the potential on the first segment, and (c) is too high with respect to that on the first.

FIG. 4a illustrates by the curve 52 that the number of secondary electrons from the left and rising edge of the specimen 50 is greater than the number collected from the right and falling edge of the specimen.

Figure 4B:
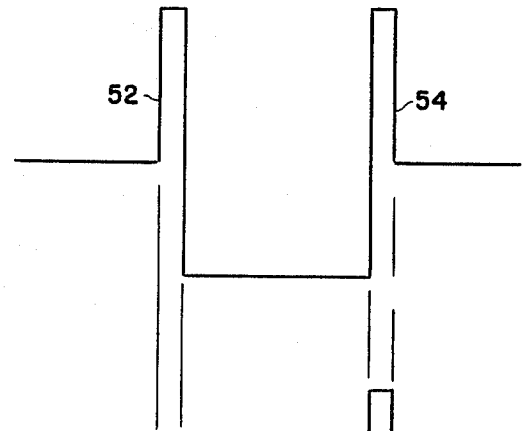

FIG. 4b illustrates the case wherein the potential applied to the grid 48 is properly balanced with that on grid 46 so that equal numbers of secondary electrons are collected from the left and right edges. It is to be noted that the potentials on the grids 46 and 48 are not necessarily equal, but only in a magnitude relationship that provides for equal electron collection from the two edges. Photographs taken of the electron microscope image when the two half-grids are thus adjusted will also show equally bright rising and falling edges.

Figure 4C:
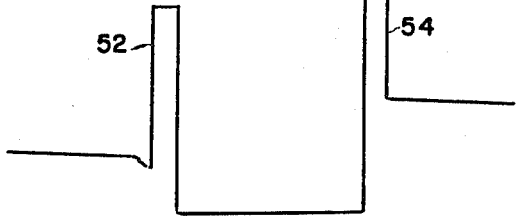

FIG. 4c illustrates a case in which the potential on the half-grid 48 exceeds that on the fixed potential grid 46 by an amount sufficient to cause more electrons to be collected from the right or falling edges of the specimen. There are instances when such conditions are desired, such as the need to highlight or shade a desired side of the photographed specimen.

I claim:

1. In an electron microscope having an electron beam adjusting means at a reference potential for focusing an electron beam on a specimen, secondary emission electron collecting means including a scintillator at a high positive potential for detecting secondary emission electrons released by the specimen, and a low voltage grid interposed between the scintillator and the specimen for attracting the secondary emission electrons, the improvement comprising:

a second grid interposed between the specimen and the low voltage grid, said second grid being formed of a plurality of substantially coplanar grid components, and means for applying a positive potential such that each grid is at a separately controllable positive potential below that on said low voltage grid.

2. In an electron microscope having an electron beam adjusting means at a reference potential for focusing an electron beam on a specimen, secondary emission electron detection means including a scintillator at a high positive potential for detecting secondary emission electrons released by an electron bombarded specimen, and a low voltage grid interposed between the scintillator and the specimen for attracting released secondary emission electrons, the improvement comprising:

a split grid formed of first and second co-planar grids interposed between the specimen and the low voltage grid means for applying a first positive potential to the first grid in said co-planar grids and applying to the second grid of said co-planar grids a second positive potential variable above and below the potential on said first grid.

3. The improvement claimed in claim 2 wherein the potentials applied to said first and second co-planar grids are lower than the low potential on said low voltage grid.

4. The improvement claimed in claim 3 wherein the first positive potential applied to said first grid is approximately 90 volts.

* * * * *